United States Patent
Lee et al.

(10) Patent No.: US 7,551,904 B2
(45) Date of Patent: Jun. 23, 2009

(54) APPARATUS AND METHOD FOR HIGH EFFICIENCY POWER AMPLIFICATION FOR A MOBILE COMMUNICATION SYSTEM

(75) Inventors: Dong-Geun Lee, Seoul (KR); Bum-Man Kim, Pohang-si (KR); Jeong-Hyeon Cha, Pohang-si (KR)

(73) Assignees: Samsung Electronics Co., Ltd (KR); Postech Foundation (KR)

( * ) Notice: Subject to any disclaimer, the term of this patent is extended or adjusted under 35 U.S.C. 154(b) by 597 days.

(21) Appl. No.: 11/262,694

(22) Filed: Oct. 31, 2005

(65) Prior Publication Data

US 2006/0094376 A1     May 4, 2006

(30) Foreign Application Priority Data

Oct. 29, 2004    (KR)    .................... 10-2004-0087309

(51) Int. Cl.
*H04B 1/04* (2006.01)
*H04L 27/12* (2006.01)
*H04L 27/20* (2006.01)

(52) U.S. Cl. .................. 455/110; 455/111; 455/114.3; 375/302; 375/308

(58) Field of Classification Search .............. 455/110, 455/111, 114.1, 114.3, 127.1; 375/296, 297, 375/302, 308
See application file for complete search history.

(56) References Cited

U.S. PATENT DOCUMENTS

| 4,730,344 | A | * | 3/1988 | Saha | 375/280 |
|---|---|---|---|---|---|
| 5,903,555 | A | * | 5/1999 | Wildauer et al. | 370/342 |
| 6,032,028 | A | * | 2/2000 | Dickey et al. | 455/110 |
| 6,242,975 | B1 | * | 6/2001 | Eidson et al. | 375/297 |
| 6,473,009 | B2 | * | 10/2002 | Grosso et al. | 341/102 |
| 6,504,879 | B1 | * | 1/2003 | Iwamatsu | 375/298 |
| 6,587,513 | B1 | * | 7/2003 | Ichihara | 375/296 |
| 6,594,309 | B1 | * | 7/2003 | Botti et al. | 375/238 |
| 6,639,937 | B2 | * | 10/2003 | Doetsch et al. | 375/130 |
| 6,996,382 | B2 | * | 2/2006 | Higuchi | 455/126 |
| 7,010,280 | B1 | * | 3/2006 | Wilson | 455/126 |

(Continued)

FOREIGN PATENT DOCUMENTS

JP      06-021731      1/1994

(Continued)

OTHER PUBLICATIONS

Yuanxun Wang, A Class-S Amplifier Architecture with Envelope Delta-Sigma Modulation, 2002 IEEE, pp. 177-180.

(Continued)

*Primary Examiner*—Duc M Nguyen
(74) *Attorney, Agent, or Firm*—The Farrell Law Firm, LLP (57) ABSTRACT

An method and apparatus for power amplification in a mobile communication system, wherein a signal converter for receives signals from a baseband-side, modulates the received signals into oversampled baseband digital signals, and generates signals having a constant envelope with the oversampled base band digital signals, an up-converter up-converts the generated signals having the constant envelope to Radio Frequency (RF) signals for output, and a power amplifier amplifies the RF signals according to system setup levels and outputs envelope signals of a predetermined level.

21 Claims, 7 Drawing Sheets

U.S. PATENT DOCUMENTS

| | | | |
|---|---|---|---|
| 7,058,139 B2 * | 6/2006 | Duperray | 375/297 |
| 2003/0006921 A1 * | 1/2003 | Stetson et al. | 341/143 |
| 2003/0123566 A1 * | 7/2003 | Hasson | 375/279 |
| 2004/0037363 A1 * | 2/2004 | Norsworthy et al. | 375/259 |

FOREIGN PATENT DOCUMENTS

| | | |
|---|---|---|
| KR | 1020000035813 | 6/2000 |
| KR | 1020020019630 | 3/2002 |
| KR | 10-2004-0079918 | 9/2004 |
| WO | WO 03/056701 | 7/2003 |

OTHER PUBLICATIONS

Asbeck et al., "Synergistic Design of DSP and Power Amplifiers for Wireless Communications", IEEE Transactions on Microwave Theory and Techniques, vol. 49, No. 11, Nov. 2001.

* cited by examiner

APPARATUS AND METHOD FOR HIGH EFFICIENCY POWER AMPLIFICATION FOR A MOBILE COMMUNICATION SYSTEM

PRIORITY

This application claims priority to an application entitled "Apparatus and Method for high efficiency Power Amplification for Mobile Communication System" filed in the Korean Intellectual Property Office on Oct. 29, 2004 and assigned Ser. No. 2004-87309, the contents of which are incorporated herein by reference.

BACKGROUND OF THE INVENTION

1. Field of the Invention

The present invention relates generally to a mobile communication amplification system applied to a mobile communication system, and more particularly to an apparatus and a method for high efficiency power amplification for efficiently amplifying signals having a large Peak-to-Average Power Ratio (PAPR) in a mobile communication system.

2. Description of the Related Art

Commonly, a power amplifier is classified according to the quantity of operation time and bias current of an output apparatus. Accordingly, a power amplifier may be classified into a class-A amplifier, a class-B amplifier, a class-C amplifier, a class-AB amplifier, a class-F amplifier, a class-S amplifier, etc. Hereinafter, a class-S amplifier and a class-S system using the class-S amplifier will be described and a description for other power amplifiers will be omitted.

Figure 1:
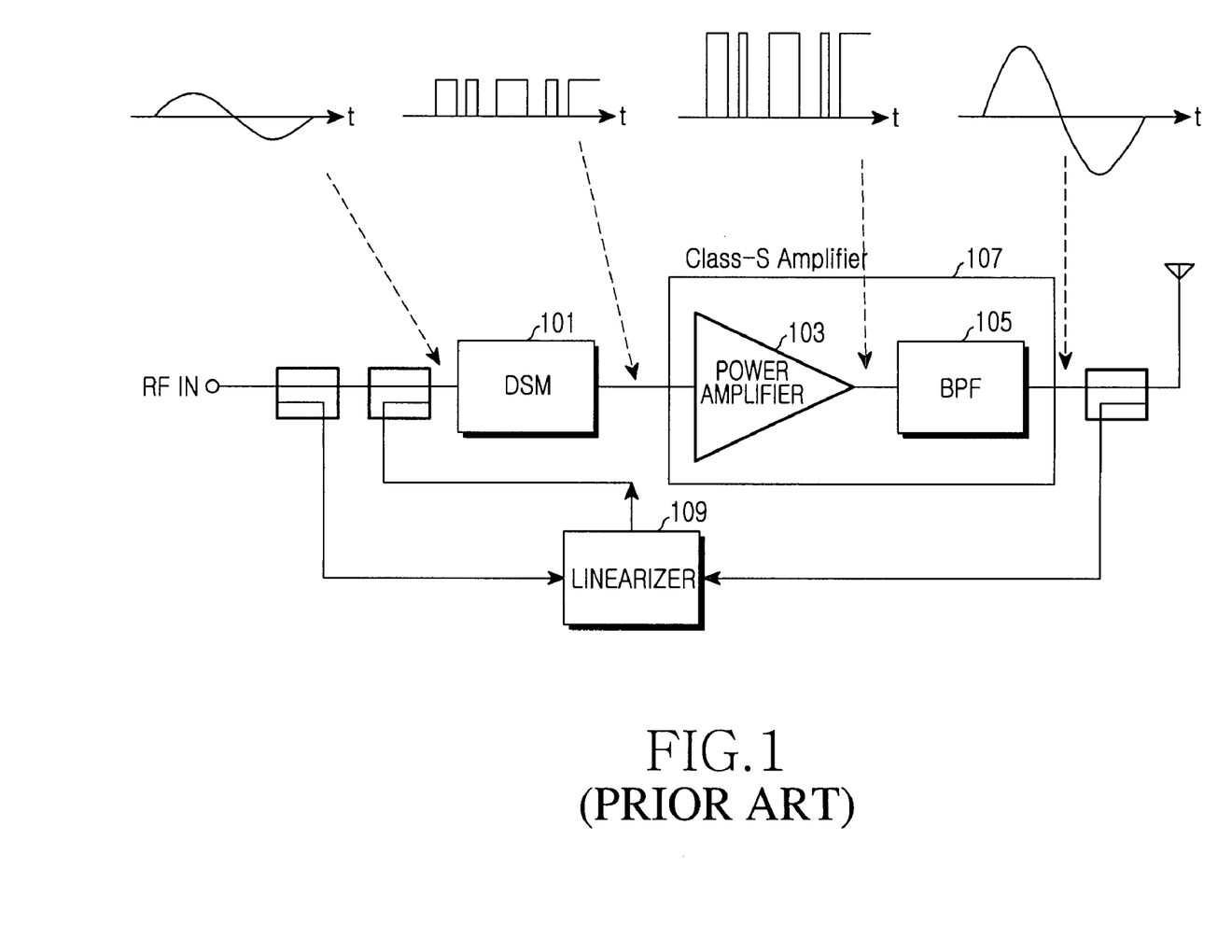
FIG. 1 is a block diagram illustrating a conventional class-S system.

FIG. 1 is a block diagram illustrating a conventional class-S system including a class-S power amplifier. Referring to FIG. 1, the class-S system includes a Delta-Sigma Modulator (DSM) 101, a class-S amplifier 107 having a power amplifier 103 and a Band-Pass Filter (BPF) 105, and a linearizer 109. The DSM 101 receives Radio Frequency (RF) signals, converts the RF signals to RF pulse signals through a delta-sigma modulation, and outputs the RF pulse signals to the power amplifier 103. The power amplifier 103 operating in a switching mode amplifies the RF pulse signals input from the DSM 101 according to request levels by a system setup, and outputs the amplified RF pulse signals to the BPF 105. The BPF 105 receives the amplified RF pulse signals and removes switching harmonic from the received signals, thereby restoring the original signals for output. Because the power amplifier 103 operates in a switching mode, it theoretically has an efficiency of 100%.

The linearizer 109 removes non-linear components generated by the DSM 101 and the power amplifier 103 for output.

In order to generate RF pulse signals, the prior art uses an oversampling analog-to-digital converter such as a bandpass DSM. In a conventional mobile communication system, RF signals have a frequency of more than 800 MHz. Accordingly, the prior art is problematic in that it requires a bandpass DSM of oversampling of four times as many as 800 MHz, i.e., oversampling of about 3.2 GHz. For example, an IMT-2000 communication system requires a high speed DSM of more than about 8 GHz.

Additionally, the switching mode power amplifier is problematic in that it must operate at a frequency corresponding to up to minimum five times the input RF frequency, i.e., it must have broadband characteristics, in order to exactly amplify the RF pulse signals output from the DSM. For example, an IMT-2000 communication system requires a switching mode power amplifier operating at about 10 GHz.

However, it is very difficult to actually realize the high speed bandpass DSM and the switching mode power amplifier, and they are very expensive. Further, it is very difficult to match broadband input signals with input impedance of the power amplifier.

A conventional DSM basically uses an oversampling and noise shaping technique in order to increase a Signal-to-Noise Ratio (SNR), and oversampling of four times faster than the sampling speed having a minimum Nyquist sampling rate is required. However, such oversampling has been currently used only in a relatively low frequency application such as an audio system due to limitation of digital technology as described above. Accordingly, it is necessary to provide an apparatus and a method capable of applying the DSM to a mobile communication amplification system.

SUMMARY OF THE INVENTION

Accordingly, the present invention has been designed to solve the above and other problems occurring in the prior art. It is an object of the present invention to provide an apparatus and a method capable of applying a DSM to a mobile communication amplifier system.

It is another object of the present invention to provide an apparatus and a method capable of dramatically reducing a burden of oversampling and processing complex data signals in a mobile communication amplification system.

It is further another object of the present invention to provide an apparatus and a method for generating signals having a constant envelope by means of a DSM in a mobile communication system.

It is still another object of the present invention to provide an apparatus and a method that dramatically improve performance of a power amplifier by applying signals having a constant envelope to a base station amplification mobile system for mobile communication.

It is yet another object of the present invention to provide an apparatus for delta-sigma modulation, which has an operating frequency far lower than that of a conventional class-S amplifier system by converting an envelope of input signals to a pulse waveform by means of a baseband DSM in a mobile communication system, and a method using the same.

It is yet another object of the present invention to provide a high efficiency power amplifier system by means of a DSM having a low operating frequency in a mobile communication system.

In order to accomplish the aforementioned and other objects, according to an aspect of the present, there is provided an apparatus for power amplification in a mobile communication system. The apparatus includes: a signal converter for receiving signals from a baseband-side, modulating the received signals into oversampled baseband digital signals, and generating signals having a constant envelope with the oversampled base band digital signals; an up-converter for up-converting the generated signals having the constant envelope to Radio Frequency (RF) signals for output; and a power amplifier for amplifying the RF signals according to system setup levels and outputting envelope signals of a predetermined level.

According to another aspect of the present, there is provided an apparatus for power amplification in a mobile communication system. The apparatus includes: a Low Pass Delta-Sigma Modulator (LPDSM) for receiving signals from a baseband-side and modulating the received signals into oversampled baseband digital signals; an IQ modulator for receiving the oversampled baseband digital signals output from the LPDSM and generating signals having a constant envelope; an up-converter for up-converting the constant envelope signals generated by the IQ modulator to Radio Frequency (RF) signals; and a power amplifier for amplifying the RF signals according to system setup levels and outputting envelope signals of a predetermined level.

According to further another aspect of the present, there is provided a method for power amplification in a mobile communication system. The method includes the steps of: converting input signals from a baseband-side to oversampled baseband digital signals; IQ-modulating the oversampled baseband digital signal into constant envelope signals; up-converting the constant envelope signals to Radio Frequency (RF) signals; amplifying the RF signals according to system setup levels; and generating envelope signals of a predetermined level from the amplified RF signals.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE PREFERRED EMBODIMENT

Hereinafter, preferred embodiments according to the present invention will be described in detail with reference to the accompanying drawings. In the following description, a detailed description of known functions and configurations incorporated herein will be omitted when it may obscure the subject matter of the present invention.

The present invention is directed to a class-S amplifier including a Delta-Sigma Modulator (DSM), a power amplifier operating in a switching mode, and a BPF for restoring the original signals, for efficiently amplify signals having a large Peak-to-Average Power Ratio (PAPR).

Basically, a class-S amplifier uses an oversampling and noise shaping technique in order to increase a Signal-to-Noise Ratio (SNR). Herein, oversampling of four times faster than the sampling speed having a minimum Nyquist sampling rate is required. However, such oversampling has been currently used only in a relatively low frequency application such as an audio system due to limitations of digital technology.

More specifically, the present invention proposes an apparatus and a method capable of applying the DSM to a mobile communication amplification system. Further, the present invention proposes an apparatus and a method capable of dramatically reducing a burden of oversampling and processing complex data signals.

Figure 2:
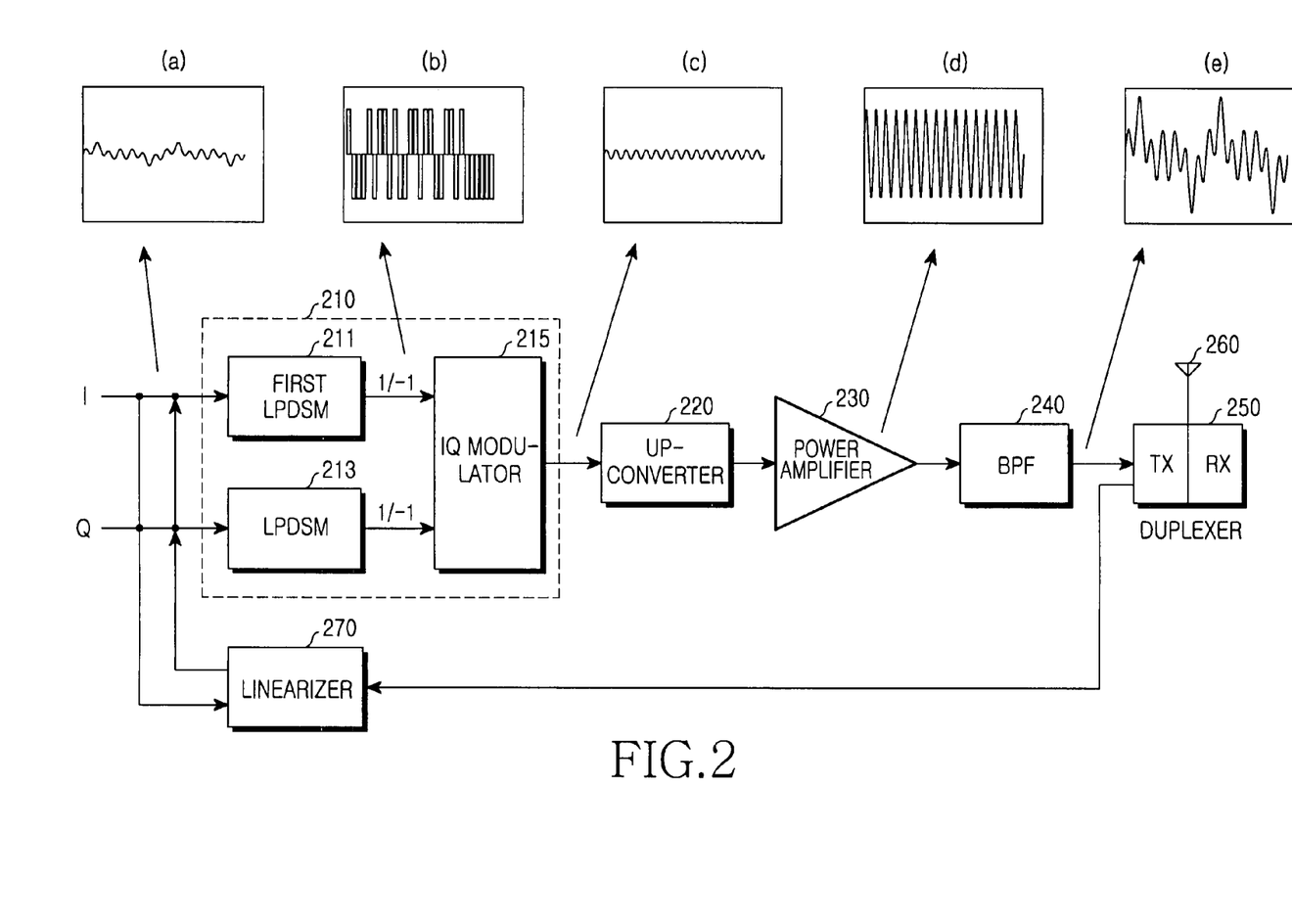
FIG. 2 is a block diagram illustrating a high efficiency amplifier system using a Low Pass DSM (LPDSM) according to the present invention.

FIG. 2 is a block diagram illustrating a high efficiency amplifier system using a Low Pass DSM (LPDSM) according to an embodiment of the present invention. Referring to FIG. 2, the high efficiency amplifier system includes a signal converter 210, an up-converter 220, a power amplifier 230, a Band-Pass Filter (BPF) 240, a duplexer 250, an antenna 260, and a linearizer 270. The signal converter 210 includes a first LPDSM 211, a second LPDSM 213, and an IQ modulator 215.

The first LPDSM 211 and the second LPDSM 213 receive I and Q signals from a baseband-side, modulate the received I and Q signals into oversampled baseband digital signals of one bit, and output the digital signals to the IQ modulator 215, respectively. The IQ modulator 215 receives the signals output from the first LPDSM 211 and the second LPDSM 213, converts the received signals to Quadrature Phase Shift Keying (QPSK) signals, generates signals having a constant envelope with the QPSK signals, and outputs the generated signals to the up-converter 220. The IQ modulator 215 classifies the received signals into the I and Q signals for an efficient management in a limited frequency, performs a multiplication process and an addition process of a specific function for internal input digital signals, and outputs analog signals.

The up-converter 220 up-converts the signals IQ-modulated by the IQ modulator 215 to Radio Frequency (RF) signals and outputs the RF signals to the power amplifier 230. The power amplifier 230 amplifies the RF signals up-converted by the up-converter 220 according to system setup levels, and outputs envelope signals of a predetermined level to the BPF 240.

The BPF 240 receives the RF signals amplified by the power amplifier 230, removes switching harmonic included in the RF signals so as to restore the original signals, and outputs the original signals to the duplexer 250. The BPF 240 suppresses out-of-band noise.

The duplexer 250 suppresses noise for signals having passed through the BPF 240. The antenna 260 transmits the final output signals from the duplexer 250 through the air.

The linearizer 270 compensates non-linear characteristics of the first LPDSM 211, the second LPDSM 213, and in the switching operation of the power amplifier 230, and maintains the linearity of the entire system. That is, the linearizer 270 compares the signals coupled after the BPF 240 for removing out-of-band noise with the signals, e.g., the complex data input signals I and Q, before the first LPDSM 211 and the second LPDSM 213, and removes noise from the final signals in order to compensate for the non-linear characteristics, thereby maintaining the linearity of the entire system.

As illustrated in FIG. 2, in the high efficiency amplifier system of the present invention, the input signals (I and Q signals) transmitted from the baseband-side are input to the first LPDSM 211 and the second LPDSM 213, respectively. The input signals correspond to mobile communication signals including oversampled baseband Code Division Multiple Access (CDMA) signals, which are expressed by the complex data of I and Q.

According to a conventional method for generating the signals, the complex data signals are directly used as the input signals of an IQ modulator. In this case, signals having a large PAPR are generated. Consequently, a power amplifier must perform very inefficient operations in order to acquire high linearity. That is, because a back-off or feed-forward linearizer, which operates the power amplifier with power higher than average power, must be additionally used in order to linearly amplify signals having a large PAPR, the efficiency of the power amplifier may deteriorate.

However, according to the present invention, the signal converter 210 converts the I and Q signals to one bit digital signals of 1/−1 by means of the first LPDSM 211 and the second LPDSM 213, and uses the converted signals as the input of the IQ modulator 215. Accordingly, the IQ modulator 215 outputs signals having a constant envelope such as QPSK signals and Offset QPSK (OQPSK) signals.

Because the output signals of the signal converter 210 correspond to the signals having the constant envelope as described above, the power amplifier 230 uses the signals as input to operate more linearly.

The first LPDSM 211 modulates the I signals input from the baseband-side into the oversampled baseband digital signals of one bit and outputs the digital signals to the IQ modulator 215. The second LPDSM 213 modulates the Q signals input from the baseband-side into the oversampled baseband digital signals of one bit and outputs the digital signals to the IQ modulator 215.

The IQ modulator 215 receives the signals output from the first LPDSM 211 and the second LPDSM 213, modulates the received signals by a modulation scheme applied to the system, e.g., a QPSK scheme, and outputs the modulated signals to the up-converter 220. The up-converter 220 up-converts the signals IQ-modulated by the IQ modulator 215 to the RF signals and outputs the RF signals to the power amplifier 230, which amplifies the RF signals up-converted by the up-converter 220 and outputs the amplified signals to the BPF 240.

Transmission signals in a mobile communication system using a conventional CDMA scheme, Wideband CDMA (WCDMA) scheme, or Orthogonal Frequency Division Multiplexing (OFDM) scheme have a large PAPR. Accordingly, the signals are modulated into one bit digital signals through the LPDSMs 211 and 213, and are then modulated into the Intermediate Frequency (IF) signals having a constant envelope through the IQ modulator 215.

Basically, each of the LPDSMs 211 and 213 enables one bit to have information of two levels. However, in order to generate one bit signals, some quantization noise must be added to the original signals. The quantization noise is subjected to shaping by a loop filter having a feedback path, so that high linearity can be achieved in a signal band. Herein, this will be referred to as noise shaping and be described in more detail with reference to FIG. 3.

Figure 3:
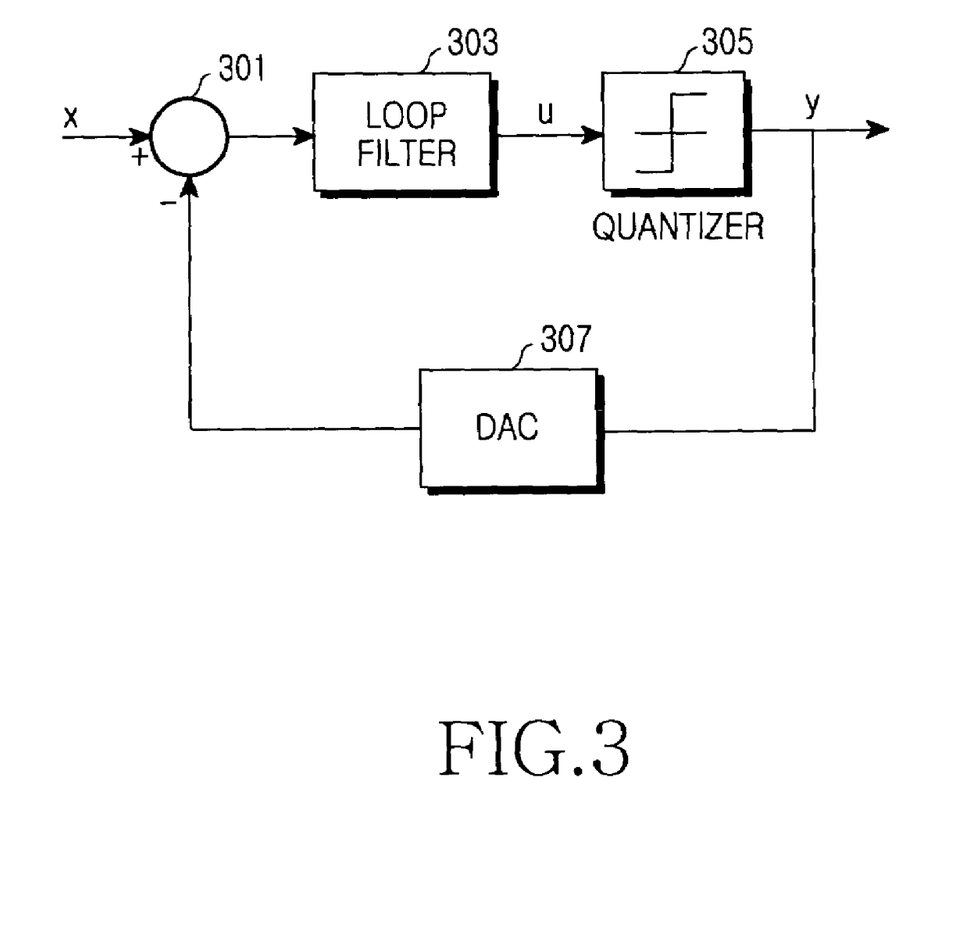
FIG. 3 is a block diagram illustrating an LPDSM according to the present invention.

FIG. 3 is a block diagram illustrating the LPDSM in FIG. 2. Referring to FIG. 3, each of the LPDSMs 211 and 213 includes an operator 301, a loop filter 303, a quantizer 305, and a Digital-to-Analog Converter (DAC) 307. Input signals x are operated with signals having passed through the DAC 307 in the operator 301. The signals operated in the operator 301 are then output as signals u via the loop filter 303. The signals u are converted to one bit output signals y by the quantizer 305. Noise generated in the quantization by the quantizer 305 is reduced by an oversampled amount through oversampling.

The quantized signals are feedback through the DAC 307 and operated with input signals in the operator 301. The operated input signals become shaped signals through the loop filter 303. The DAC 307 converts the output signals, i.e., one bit pulse, of the quantizer 305 to analog signals, thereby enabling the analog signals to be operated with the input signals in the operator 301.

The loop filter 303 pushes out in-band noise to an out-of-band area, thereby achieving high linearity in a signal band.

Figure 4:
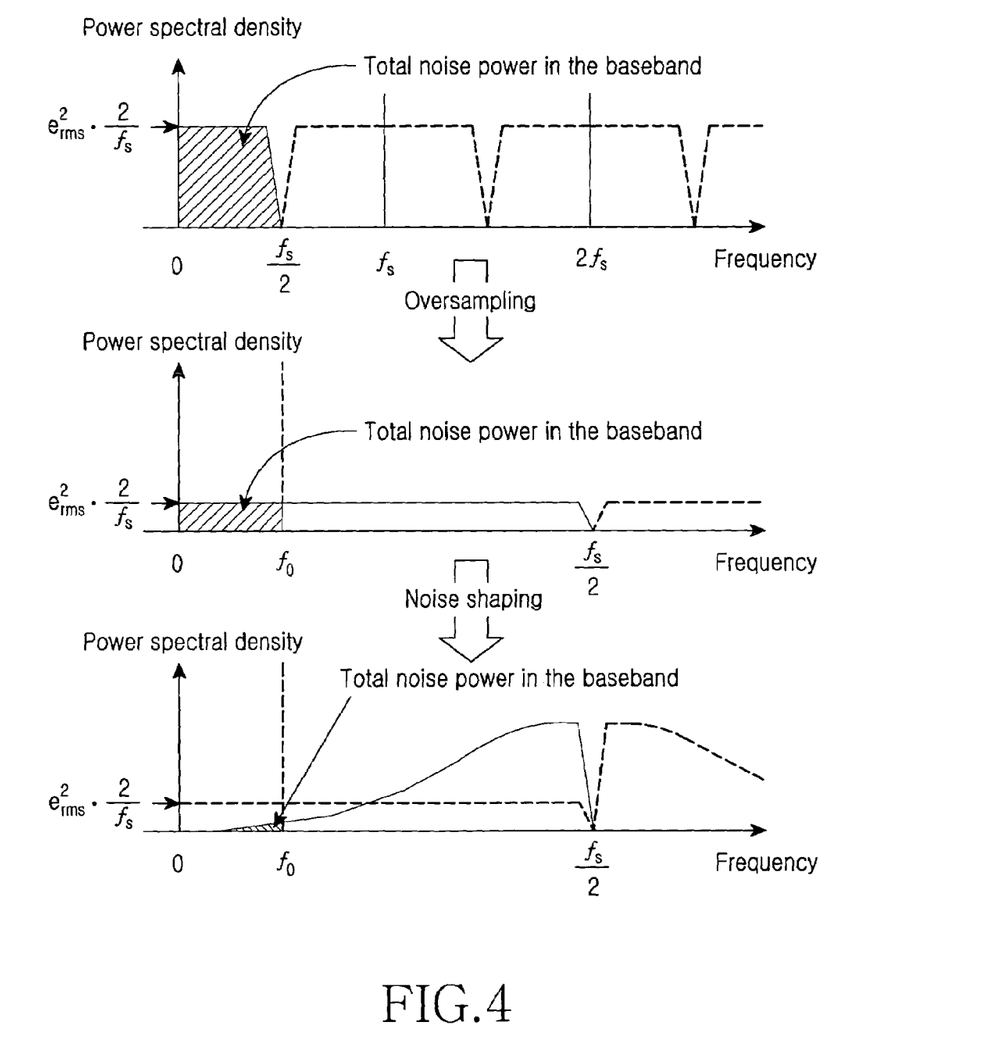
FIG. 4 is a diagram illustrating an effect resulting from oversampling and noise shaping of an LPDSM.

FIG. 4 is a diagram illustrating an effect resulting from oversampling and noise shaping of the LPDSM. Referring to FIG. 4, each of the LPDSMs 211 and 213 pushes out quantization noise, which is generated in the conversion to one bit signals through the oversampling and noise shaping, to a high frequency band having no signals, thereby acquiring a large SNR in a baseband having signals. In-band noise is dispersed to a wide band through the oversampling. Therefore, the in-band noise is reduced as illustrated in the middle in FIG. 4, and then is pushed out to an out-of-band area through the noise shaping of the loop filter./as a result, it is possible to acquire a large SNR as illustrated in the bottom in FIG. 4.

In the prior art, because such a delta-sigma modulation is performed in the RF band as described in FIG. 1, oversampling must be performed with a frequency of more than four times the a minimum carrier frequency in order to ensure a SNR. However, in the present invention, because the delta-sigma modulation is performed in the baseband, a maximum oversampling may be performed with a basic carrier frequency.

As described above, the signal converter 210 in FIG. 2 converts the I and Q signals to one bit digital signals of 1/−1 by means of the LPDSMs 211 and 213, and uses the converted signals as the input of the IQ modulator 215. Accordingly, the IQ modulator 215 outputs signals having a constant envelope such as QPSK signals and OQPSK signals. For example, the IQ modulator 215 outputs the signals having the constant envelope as illustrated in the simulation result value (c) in FIG. 2.

According to the present invention, because the output signals of the signal converter 210 correspond to the signals having the constant envelope, the power amplifier 230 uses the signals as input to operate more linearly. Therefore, the power amplifier 230 may use a class-B power amplifier, a class-C power amplifier, a class-F power amplifier, etc., for amplifying the signals having the constant envelope, in order to acquire high efficiency. Identically, the class-F power amplifier, etc., has an efficiency of 100%.

The output signals of the power amplifier 230 pass through the BPF 240, which suppresses out-of-band noise. Thereafter, the signals are transmitted to the air through the antenna 260 via the duplexer 250. Because the BPF 240 and the duplexer 250 perform the overlapping function, the BPF 240 may also be omitted when the duplexer 250 has superior performance.

Different from an existing linearizer used in order to compensate for Amplitude Modulation (AM)-AM and AM-Phase Modulation (PM) distortion of the power amplifier, the linearizer 270 proposed by the present invention compensates for the non-linear characteristics of the LPDSMs 211 and 213 and the non-linear characteristics in the switching operation of the power amplifier 230, thereby enabling the linearity of the entire system to be maintained.

Reference numerals (a) to (e) in FIG. 2 represent simulation results of the output signals of each element constituting the high efficiency amplifier system using the LPDSM according to the present invention. More specifically, reference numeral (a) is input signals having a large PAPR and converted to one bit signals (b) through the LPDSMs 211 and 213. The one bit signals (b) are converted to the IF signals (c) having a constant envelope through the IQ modulator 215, and converted to transmission frequency signals through the up-converter 220. The power amplifier 230 amplifies the transmission frequency signals to the high power signals (d), and the BPF 240 removes out-of-band noise and outputs the signals (e) having an amplified form of the signals (a).

Figure 5:
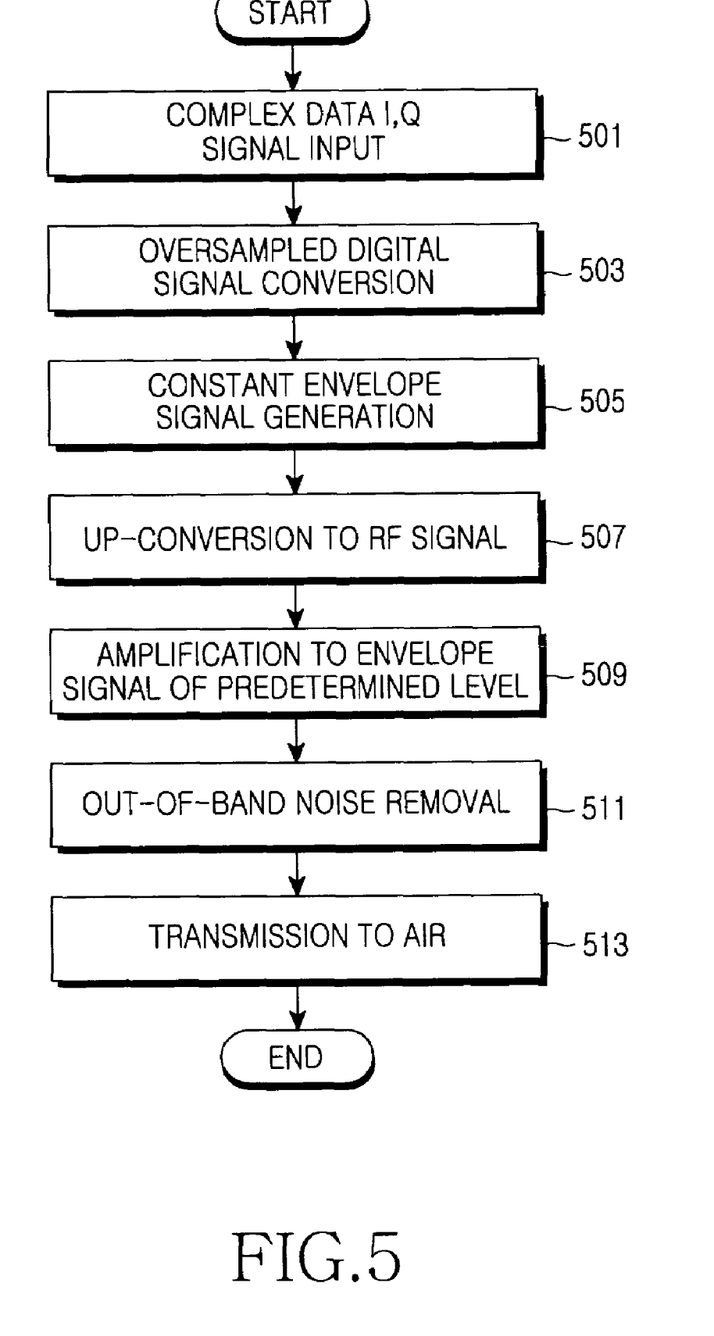
FIG. 5 is a flow diagram illustrating an operation process of a high efficiency amplification system using a low pass delta-sigma modulation scheme according to the present invention.

FIG. 5 is a flow diagram illustrating an operation process of the high efficiency amplification system using a low pass delta-sigma modulation scheme according to the present invention. Referring to FIG. 5, in step 501, the complex data I and Q signals are received. In step 503, the I and Q signals are converted to oversampled digital signals, respectively. In step 505, signals having a constant envelope are generated with the signals converted to the digital signals through I and Q modulation. In step 507, the signals having the constant envelope are up-converted to RF signals. In step 509, the RF signals are amplified according to system setup levels so as to generate signals having a constant envelope, which have been amplified with a predetermined desired level.

In step 511, signals obtained by removing out-of-band noise from the amplified signals are output. Thereafter, in step 513, the final output signals are transmitted via the antenna.

The present invention may further perform a linearization process for maintaining the linearity of the entire system by removing noise from the final output signals in order to compensate for non-linear characteristics.

Figure 6A:
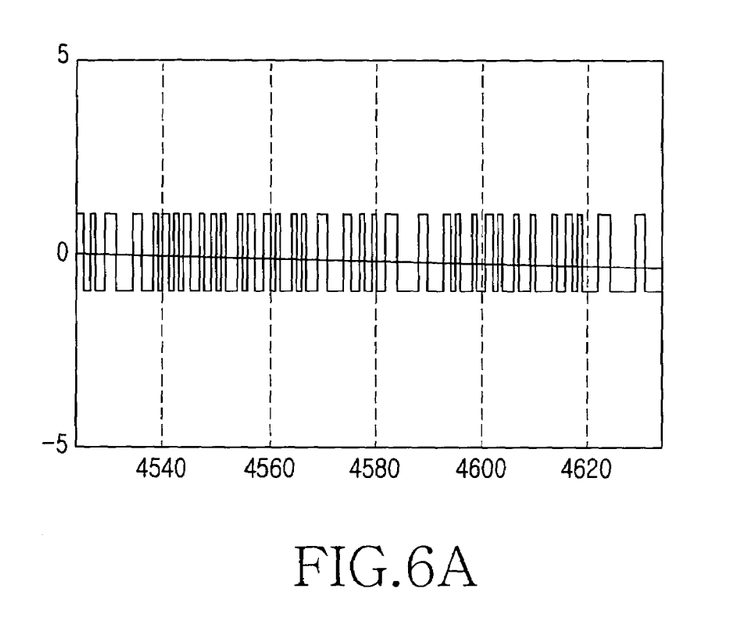
FIGS. 6A and 6B are graphs illustrating characteristics in a time domain and a frequency domain of LPDSM output signals according to an embodiment of the present invention.
Figure 6B:
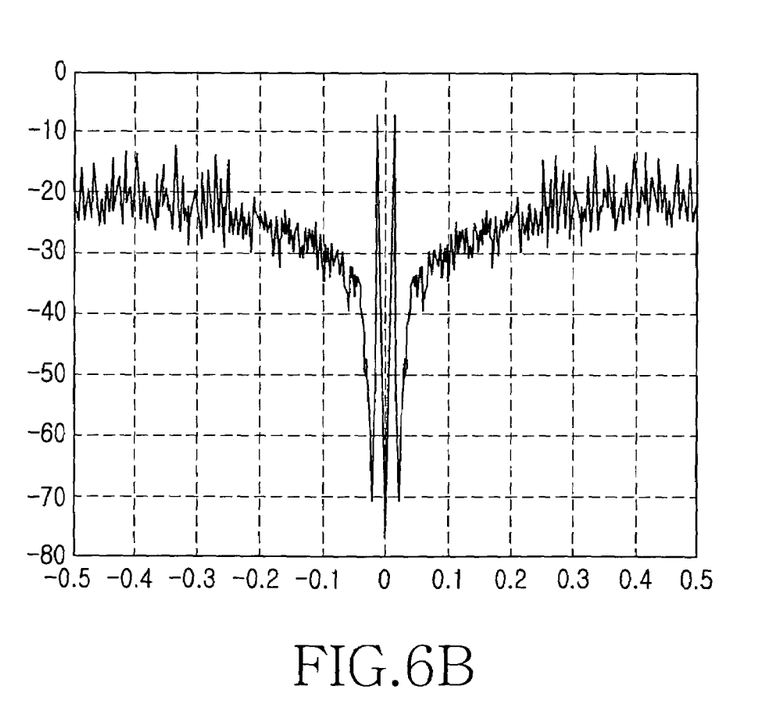

FIGS. 6A and 6B are graphs illustrating the characteristics of output signals of the LPDSM according to the embodiment of the present invention. More specifically, FIG. 6A is a graph illustrating the characteristics in a time domain and FIG. 6B is a graph illustrating the characteristics in a frequency domain.

FIGS. 6A and 6B show Pulse Width Modulation (PWM) signals resulting from a simulation performed using sine waves oversampled with 64 times, and the PWM signals in the frequency domain. In FIGS. 6A and 6B, horizontal axes are normalized with a sampling frequency. Further, the quantization noise are significantly pushed out to a high frequency band having no input signals as described above, and a large SNR is acquired in the signal band.

Figure 7:
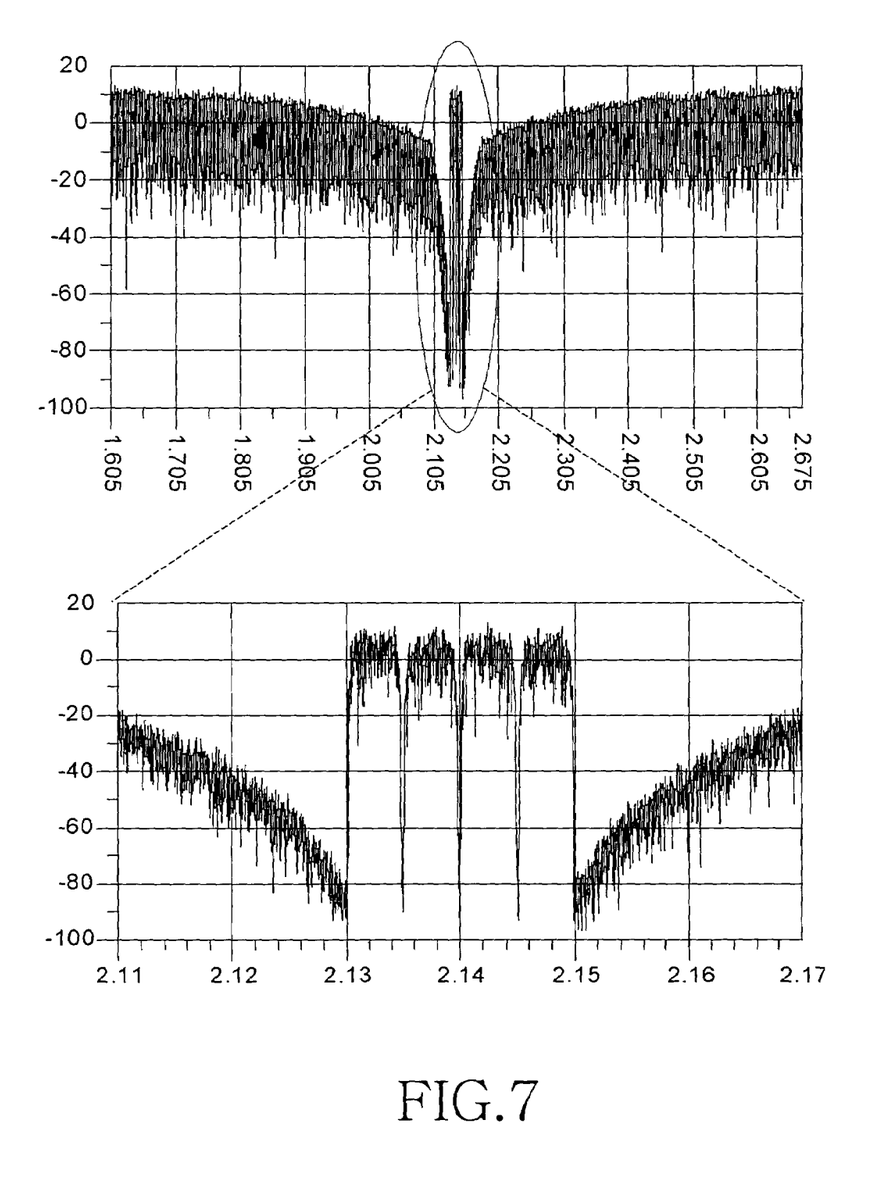
FIG. 7 is a graph illustrating output signals of an up-converter.

FIG. 7 is a graph illustrating the output signals of the up-converter in FIG. 2. More specifically, FIG. 7 illustrates a spectrum obtained by a process in which the signal converter 210 uses baseband WCDMA 4FA signals having a bandwidth of 20 MHz as input signals. The input signals are converted to one bit signals through the LPDSMs 211 and 213. The converted signals are modulated by the IQ modulator 215, and the modulated signals are up-converted to IF signals of 2.14 GHz through the up-converter 220. The operating frequency used in the LPDSM corresponds to 1.07 GHz, which is one-half of the IF. That is, the operating frequency corresponds to ⅛ of an operating frequency required in an existing DSM.

As described above, the present invention converts the envelope of input signals to a pulse waveform by means of a baseband DSM in a mobile communication system, thereby achieving a high efficiency power amplifier system having an operating frequency far lower than that of a conventional amplifier system.

According to an apparatus and a method for high efficiency power amplification for mobile communication of the present invention, a DSM can be applied to a mobile communication amplifier system. Therefore, a burden of oversampling can be dramatically reduced and complex data signals can be easily processed in a mobile communication system.

According to the present invention, a DSM is applied to a mobile communication system. Therefore, it is possible to generate signals having a constant envelope. Further, the signals having the constant envelope are applied to a base station amplification system for mobile communication, such that the performance of a power amplifier can be dramatically improved.

Additionally, according to the present invention, an envelope of input signals are converted to a pulse waveform by means of a baseband DSM in a mobile communication system, so that it is possible to achieve a high efficiency power amplifier system having an operating frequency far lower than that of a class-S amplifier system.

Although preferred embodiments of the present invention have been described for illustrative purposes, those skilled in the art will appreciate that various modifications, additions, and substitutions are possible, without departing from the scope and spirit of the invention as disclosed in the accompanying claims, including the full scope of equivalents thereof.

What is claimed is:

1. An apparatus for power amplification in a mobile communication system, the apparatus comprising:
   a Low Pass Delta-Sigma Modulator (LPDSM) for receiving baseband signals from a baseband-side and modulating the received baseband signals into oversampled baseband digital signals;
   an IQ modulator for receiving the oversampled baseband digital signals output from the LPDSM and generating signals having a constant envelope by IQ-modulating the oversampled baseband digital signals;
   an up-converter for up-converting the constant envelope signals to Radio Frequency (RF) signals; and
   a power amplifier for amplifying the RF signals according to system setup levels and outputting the amplified RF signals having a constant envelope of a predetermined level,
   wherein the baseband signals are oversampled below a carrier frequency and the oversampled baseband digital signals are I and Q complex data signals having a constant amplitude and the IQ modulator generates the constant envelope signals using a modulation scheme based on Quadrature Phase Shift Keying (QPSK) modulation.

2. The apparatus as claimed in claim 1, further comprising a Band-Pass Filter (BPF) for receiving the amplified RF signals and restoring original signals by removing switching harmonics from the RF signals.

3. The apparatus as claimed in claim 2, wherein the BPF removes out-of-band noise.

4. The apparatus as claimed in claim 3, further comprising a linearizer for maintaining linearity of the system by compensating for non-linear characteristics of the LPDSM and non-linear characteristics in a switching operation of the power amplifier.

5. The apparatus as claimed in claim 4, wherein the linearizer compares the original signals after the BPF with the baseband signals before the LPDSM, and removes out-of-band noise from the baseband signals.

6. The apparatus as claimed in claim 2, further comprising a duplexer for suppressing noise from the original signals.

7. The apparatus as claimed in claim 1, wherein the oversampled baseband digital received signals are one bit digital signals.

8. The apparatus as claimed in claim 1, wherein the LPDSM comprises:
   a first LPDSM for modulating I complex data signals among the I and Q complex data signals into the oversampled baseband digital signals of one bit, and outputting the oversampled baseband digital signals to the IQ modulator; and
   a second LPDSM for modulating Q complex data signals among the I and Q complex data signals into the oversampled baseband digital signals of one bit, and outputting the oversampled baseband digital signals to the IQ modulator.

9. The apparatus as claimed in claim 1, wherein the IQ modulator generates the constant envelope signals using an Offset Quadrature Phase Shift Keying (OQPSK) modulation.

10. The apparatus as claimed in claim 1, wherein the power amplifier comprises a class-S RF power amplifier.

11. The apparatus as claimed in claim 1, wherein the power amplifier comprises at least one of a class-B RF power amplifier, a class-C RF power amplifier, and a class-F RF power amplifier.

12. The apparatus as claimed in claim 1, wherein the LPDSM comprises:
   an operator for operating input signals from the baseband-side with signals fedback from an output terminal;
   a loop filter for converting the operated signals of the operator to shaped signals;
   a quantizer for generating one bit digital signals with the shaped signals; and
   a Digital-to-Analog Converter (DAC) for converting the one bit digital signals to analog signals and feeding back the analog signals to the operator.

13. The apparatus as claimed in claim 12, wherein the loop filter pushes out in-band noise to an out-of-band area in order to achieve high linearity in a signal band.

14. The apparatus as claimed in claim 12, wherein noise generated in the quantizer is reduced by an oversampled amount through oversampling.

15. A method for power amplification in a mobile communication system, the method comprising the steps of:
   modulating, by a Low Pass Delta-Sigma Modulator (LPDSM), baseband input signals from a baseband-side into oversampled baseband digital signals;
   generating, by an IQ modulator, signals having a constant envelope by IQ-modulating the oversampled baseband digital signals;
   up-converting, by an up-converter, the constant envelope signals to Radio Frequency (RF) signals;
   amplifying, by a power amplifier, the RF signals according to system setup levels; and
   generating the amplified RE signals having a constant envelope of a predetermined level,
   wherein the baseband signals are oversampled below a carrier frequency and the oversampled baseband digital signals are I and Q complex data signals having a constant amplitude and the constant envelope signals are generated using a modulation scheme based on Quadrature Phase Shift Keying (QPSK) modulation.

16. The method as claimed in claim 15, further comprising a step of restoring, by a Band Pass Filter (BPF), original signals by removing out-of-band noise from the amplified RF signals.

17. The method as claimed in claim 16, further comprising the steps of compensating, by a linearizer, for non-linear characteristics of the baseband signals and non-linear characteristics in the amplified signals, in order to maintain linearity.

18. The method as claimed in claim 17, wherein the baseband signals are compared with the original signals in order to remove noise from the baseband signals.

19. The method as claimed in claim 15, wherein the constant envelope signals are generated using an Offset Quadrature Phase Shift Keying (OQPSK) modulation.

20. The method as claimed in claim 15, wherein the oversampled baseband digital signals are one bit digital signals.

21. The method as claimed in claim 15, wherein I complex data signals among the I and Q complex data signals are modulated into the oversampled baseband digital signals having one bit, and Q complex data signals among the I and Q complex data signals are modulated into the oversampled baseband digital signals having one bit.

* * * * *